(12) United States Patent
Meitinger et al.

(10) Patent No.: US 11,108,405 B2
(45) Date of Patent: Aug. 31, 2021

(54) DEVICES AND METHODS FOR COMPRESSION AND DECOMPRESSION

(71) Applicant: Infineon Technologies AG, Neubiberg (DE)

(72) Inventors: Claudia Meitinger, Aichach (DE); Roland Ebrecht, Augsburg (DE); Peter Huewe, Gersthofen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/903,804

(22) Filed: Jun. 17, 2020

(65) Prior Publication Data
US 2020/0395953 A1 Dec. 17, 2020

(30) Foreign Application Priority Data
Jun. 17, 2019 (DE) .......................... 102019208780.9

(51) Int. Cl.
*H03M 7/30* (2006.01)
(52) U.S. Cl.
CPC ....... *H03M 7/3088* (2013.01); *H03M 7/3086* (2013.01); *H03M 7/6005* (2013.01); *H03M 7/6011* (2013.01)
(58) Field of Classification Search
CPC ............. H03M 7/3088; H03M 7/3086; H03M 7/6011; H03M 7/6005
See application file for complete search history.

(56) References Cited

U.S. PATENT DOCUMENTS

| | | | | |
|---|---|---|---|---|
| 5,155,484 A | * | 10/1992 | Chambers, IV | ......... G06K 9/72 341/55 |
| 5,319,793 A | * | 6/1994 | Hancock | .............. H04N 9/8045 345/419 |
| 5,583,656 A | * | 12/1996 | Gandhi | ..................... G06T 9/00 358/403 |
| 5,953,503 A | | 9/1999 | Mitzenmacher | |
| 7,966,424 B2 | * | 6/2011 | Abdo | ..................... H03M 7/30 709/247 |

OTHER PUBLICATIONS

Youngcheul Wee and Taehwa Kim, "A New Code Compression Method for ROTA", IEEE Transactions on Consumer Electronics, vol. 56, No. 4, Nov. 2010.

\* cited by examiner

*Primary Examiner* — Brian K Young
(74) *Attorney, Agent, or Firm* — Cooper Legal Group, LLC (57) ABSTRACT

A device for compressing first data which are to be compressed comprises a control unit configured to compress the first data based upon further data to obtain compressed data. The control unit is configured to provide memory area information indicative of a memory location of the further data.

26 Claims, 8 Drawing Sheets

DEVICES AND METHODS FOR COMPRESSION AND DECOMPRESSION

RELATED APPLICATION

This application claims priority to German Patent Application No. 102019208780.9, filed on Jun. 17, 2019, entitled "Vorrichtungen and Verfahren zum Komprimieren bzw. Dekomprimieren", which is incorporated by reference herein in its entirety.

SUMMARY

The present disclosure relates to a device and a method for compressing data which are to be compressed and to a device and a method for decompressing compressed data. For example, the present disclosure relates to the reduction of a volume of compressed data for embedded systems using known data.

Compression methods are used in the transmission of data in order to reduce the data volume of the data which are to be transmitted during the transmission. In field upgrade scenarios, approaches to minimizing the data which are to be transmitted comprise the use of a differential field upgrade, e.g., only those data which have changed compared with a preceding version are transmitted, the compression of data or a combination thereof.

Devices and methods which enable a data transmission with a small data volume would be desirable.

Example embodiments provide a device for compressing first data which are to be compressed, comprising a control unit configured to compress the first data based upon further data to obtain compressed data, and to provide memory area information which indicates a memory location of the further data. The use of the memory area information enables data, which are not part of the first data (which are to be compressed) and therefore represent an enlarged data basis, to be used for the compression and the subsequent decompression, thus enabling a small data volume of the data which are to be compressed (e.g., a data volume of the data which are to be compressed may be smaller than a data volume of data which are to be compressed by a system that does not use the further data).

Example embodiments provide a device for decompressing compressed data. The device comprises a data memory comprising a memory area in which device data are stored. The device comprises a data interface for receiving the compressed data (e.g., the compressed data may be in addition to and/or apart from the device data). The device further comprises a control unit configured to evaluate the compressed data based upon (e.g., in terms of) memory area information which refers to the memory area of the data memory. The control unit is configured to decompress the compressed data using the device data stored in the memory area.

Example embodiments provide a method for compressing first data which are to be compressed. The method comprises a compression of the first data based upon further data to obtain compressed data. The method further comprises a provision of memory area information which indicates a memory location of the further data.

Example embodiments relate to a method for decompressing compressed data. The method comprises storing device data in a memory area of a data memory. The method further comprises receiving the compressed data (e.g., the compressed data may be in addition to and/or apart from the device data). The method comprises evaluating the compressed data based upon (e.g., in terms of) memory area information which refers to the memory area of the data memory. The method comprises decompressing the compressed data using the device data stored in the memory area.

Example embodiments further relate to a computer program with a program code to carry out methods described herein.

Further advantageous example embodiments are defined in the dependent claims.

DESCRIPTION OF THE DRAWINGS

Example embodiments are explained below with reference to the attached drawings. In the drawings.

DETAILED DESCRIPTION

Before example embodiments are explained in detail below with reference to the drawings, it should be noted that identical, functionally similar or similarly acting elements, objects and/or structures are denoted with the same reference numbers in the different figures so that the descriptions of these elements set out in different example embodiments are interchangeable or can be applied to one another.

Example embodiments relate to a compression and/or decompression of data. In this context, the terms compression and decompression relate to a lossy or lossless reduction of a data volume, i.e. a number of bits during the compression and/or an at least partial restoration of the data during the decompression.

Figure 1:
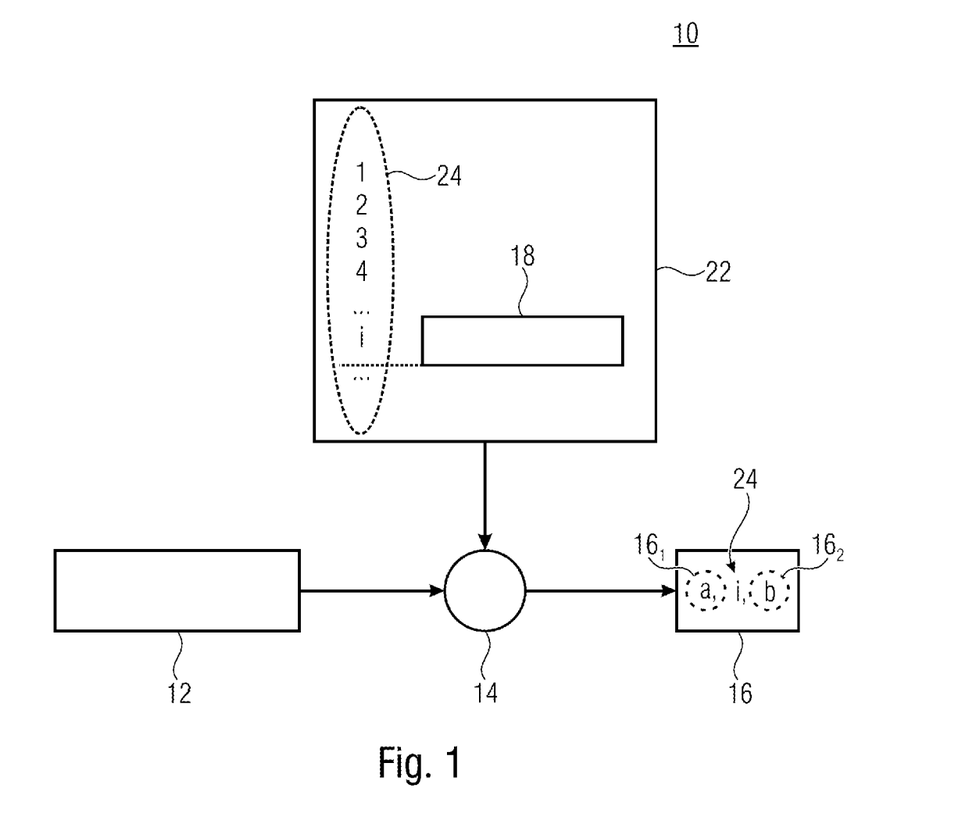
FIG. 1 shows a schematic block diagram of a device for compressing data which are to be compressed according to one example embodiment.

FIG. 1 shows a schematic block diagram of a device 10 for compressing data 12 which are to be compressed. The device 10 comprises a control unit 14 which is configured to compress the data 12 which are to be compressed in order to obtain compressed data 16. The control unit 14 can be configured to compress the data 12 which are to be compressed using a compression method, and to carry out, for example, a dictionary-based compression. A dictionary associated with the dictionary-based compression can comprise information relating to a repetition in the data which are to be compressed and the memory area information. The control unit is configured to compress the data 12 which are to be compressed based upon further data 18. For example, the control unit may be configured to compress the data 12 which are to be compressed while incorporating the further data 18.

According to example embodiments, a compression of data comprises a substitution of one bit sequence with another, shorter bit sequence. This shorter bit sequence may, for example, be a reference to a bit sequence identical to the substituted bit sequence which has already been compressed, so that the reference (e.g., only the reference) to the location where the bit sequence substituted out can be found is indicated instead of the full, uncompressed bit sequence. This example does not restrict the present example embodiments to a specific embodiment of this type, but serves merely to explain that a compression of data is carried out, for example using a dictionary in which the assignment between long and short bit sequences takes place. A data compression can be achieved, by way of example, through the transmission of short bit sequences instead of the long bit sequences.

The control unit 14 is configured to use not only the data 12 which are to be compressed, but also further, additional data 18 for the compression of the data in order to obtain the compressed data 16. The further data 18 can be stored in a volatile or non-volatile data memory 22 which replicates, for example, the memory area architecture of a target system, i.e. a system or a device which is intended or provided to decompress the compressed data 16 (e.g., once more). This means that the memory 22 can be (and/or comprise) a replication or copy of the data memory of the target system or can have at least the corresponding information.

The information includes, for example, memory areas in which the further data 18 are stored. Memory area information 24 can thus provide a reference to the data area or data areas of the data memory 22 in which the further data 18 are stored. In other words, the memory area information 24 can indicate one or more memory areas with at least one memory cell of the data memory 22 at which the further data 18 are stored.

The memory area information 24 can refer to a data memory of a device which is provided to receive the compressed data 16. Accordingly, the device 10 may know and/or determine (such as prior to and/or during the compression of the data 12 which are to be compressed) that the further data 18 is present (e.g., stored) on a device which is provided to receive the compressed data 16. The prior knowledge of the presence of the further data 18 on a device which is provided to receive the compressed data 16 can thus be exploited. The memory area information 24 can indicate at least one of a data length or a data location of the memory area. The memory area information can indicate at least a subset of the multiplicity of memory areas in which, for example, data which are to be used for the decompression are stored.

The control unit 14 can be configured to compress the data 12 which are to be compressed in a lossless or lossy manner. Examples of lossless data compressions are, for example, the LZ77 algorithm, the deflate algorithm or the Lempel-Ziv-Markow algorithm (LZMA). Lossy options for data compression are known, for example, from data compressions which are used in connection with human sensory perceptions, for example in the image domain, such as JPEG, in the video domain and/or in the audio domain.

The control unit 14 is configured to provide the compressed data 16 and the memory area information 24. The control unit 14 can be configured to embed the memory area information 24 in the compressed data 16, as shown by way of example in FIG. 1. As a result, the memory area information 24 can be part of the compressed data 16, but can also be provided as separate information, for example as a separate signal or separate bit sequence. The memory area information 24 can be inserted at any position in the compressed data 16, for example before, after or between other compressed data $16_1$ and/or $16_2$.

The device 10 can have a data interface (not shown) for transmitting the compressed data 16. This data interface can be configured as wired (e.g., for wired transmission of the compressed data 16) or wireless (e.g., for wireless transmission of the compressed data 16).

Figure 2:
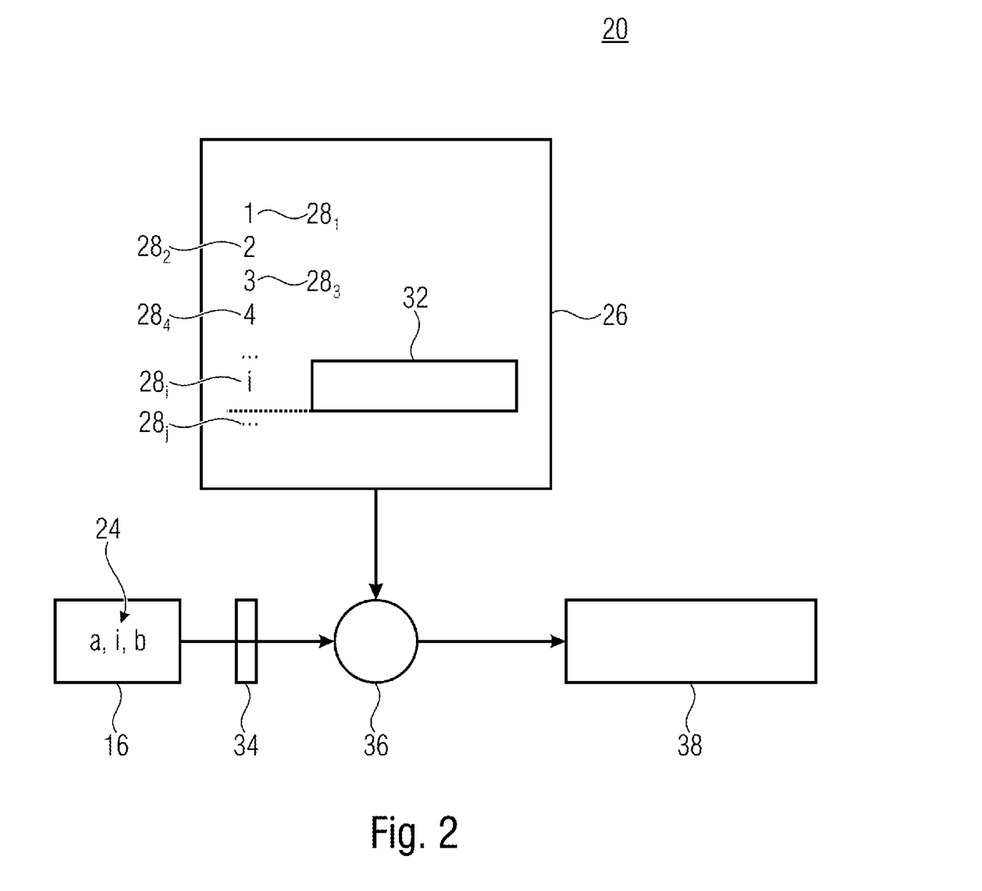
FIG. 2 shows a schematic block diagram of a device according to one example embodiment which is configured to receive compressed data in order to decompress said data.

FIG. 2 shows a schematic block diagram of a device 20 according to one example embodiment which is configured to receive the compressed data 16 in order to decompress said data. A method matching or complementary to the compression, for example similarly the LZ77 algorithm, can be used for the decompression. The device 20 comprises a data memory 26 with one or more memory areas $28_1$ to $28_j$, which are arranged, for example, according to the structure at least replicated by the data memory 22 of the device 1, and has device data 32 which are stored in one or more memory areas $28_1$ to $28_j$. The data memory 26 can be totally or partially a volatile memory and/or can be totally or partially a non-volatile memory. This means that the data memory can be a volatile memory, a non-volatile memory or a combination thereof.

The device 20 comprises a data interface 34 which is configured to receive the compressed data 16 as, for example, a wireless or wired optical or electromagnetic signal. The compressed data 16 can be received, for example, using a wireless mobile radio standard, for example 2G, 3G, LTE (Long-Term Evolution), 5G or the like. Alternatively, other, for example wireless, transmissions can also be used, for example a wireless local network. The memory area information 24 may be received with the compressed data 16 (such as where the memory area information 24 is embedded in the compressed data 16 and/or is received in a signal comprising the compressed data 16) and/or the memory area information 24 and the compressed data 16 may be received separately.

The device 20 comprises a control unit 36 which is configured to evaluate the compressed data 16 based upon (e.g., in terms of) the memory area information 24, i.e. to obtain information indicating the memory area $28_1$ to $28_j$, in the present example $28_i$, in which data to be taken into consideration are stored in the data memory 26. The control unit 36 is configured to decompress the compressed data 16 using the device data 32 stored in the memory area 26 at the location designated by the memory area information 24.

The control unit 36 is configured to obtain decompressed data 38 based upon the decompression. The decompressed data can correspond to a lossy or lossless, i.e. matching, version of the data 12 which are to be compressed. Losses can be caused, for example, by lossy compressions of the type used, for example, in image transmission, sound transmission or transmission of other data.

The data memory 22 of the device 10 may replicate the data memory 26 of the device 20 at least in terms of the content of the memory area $28_i$ to a sufficiently exact or matching extent, so that the device data 32 correspond to the further data 18 at least during the compression or decompression of data. It can suffice that only specific segments or sections or parts of the further data 18 match the device data 32, i.e. those which are used for the compression or decompression. Some parts, for example, such as the header, timestamp or the like, can therefore be ignored. Alternatively, data of this type can also be used for the compression and decompression so that, for example, the device data 32 can completely match the further data 18.

The decompression of the device 20 is therefore partially based upon data which are located outside the compressed data 16. This can also be understood to mean, for example, that a dictionary used for the decompression also has entries which are stored in the data memory 26 in the form of already previously known device data 32.

Example embodiments are suitable, for example, for embedded systems, which means that the device 20 can be an embedded system. Embedded systems can be understood to mean a data-processing or data-handling device, for example for encryption, for decryption, for filtering, for controlling an actuator, for measuring environment parameters or the like. An embedded system in connection with example embodiments described herein is also understood to mean devices whose use of the data memory is possibly at most partially placed under the control of the user. In other words, the use of the data memory 26 can be determined, for example, totally or partially by a manufacturer of the device 20 so that the manufacturer can have knowledge of the data stored there, i.e. the device data 32, at least with regard to these parts of the data memory 26.

Figure 3A:
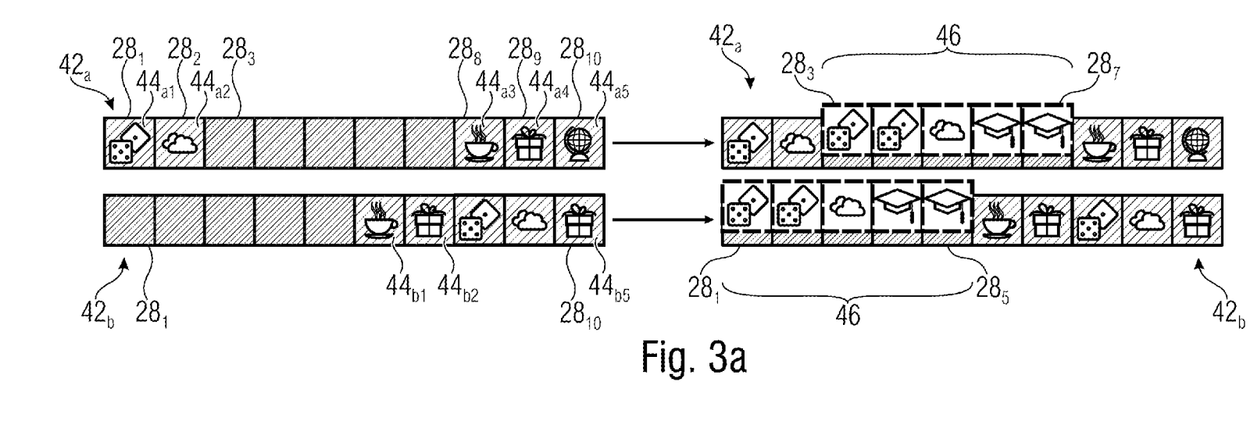
FIG. 3*a* shows an example of a schematic view of a data memory, the content of which is completely and individually controllable by a user.
Figure 3B:
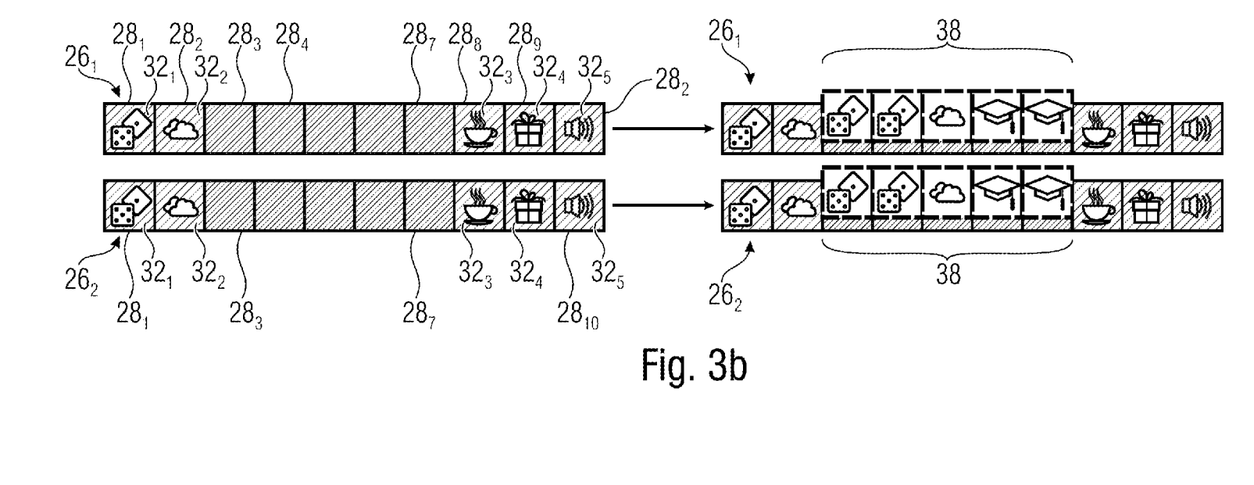
FIG. 3*b* shows data memories of embedded systems which differ but are identical in terms of design, serial number or the like according to one example embodiment.

In this respect, it is possible to use this knowledge for the compression of data, as shown with reference to FIGS. 3a and 3b.

FIG. 3a shows an example of a schematic view of a data memory 42a, the content of which is completely and individually controllable by a user. Matching symbols, for example, in FIGS. 3a and 3b can indicate matching data content and symbols differing from one another can be understood as data contents differing from one another in a memory area. The content of a data memory 42b is further shown which comprises an identical data memory but in a different, similarly individually controlled, system, so that a data content $44a_1$ to $44a_5$ of the data memory 42a may be identical to or different from data contents $44b_1$ to $44b_5$ of the data memory 42b, and/or memory areas $28_1$ to $28_{10}$ used for storing the memory contents $44a_1$ to $44b_5$ may be identical or different. This can result in additional data 46 being stored in different areas in the data memories 42a and 42b.

Conversely, FIG. 3b shows data memories $26_1$ and $26_2$ of embedded systems which differ but are identical in terms of design, serial number or the like. It can be seen here that device data $32_1$ to $32_5$ can be stored totally or partially in identical memory areas $28_1$, $28_2$, $28_8$, $28_9$ and $28_{10}$, whereas similarly matching other memory areas $28_3$ to $28_7$ can be free or otherwise occupied. This may involve memory areas, for example, which, or the data content of which, is/are overwritten.

It is thus possible to know and/or predict which memory area 28 has which device data 32 and/or at which location in the data memory $26_1$ and $26_2$ the decompressed data 38 are stored. This knowledge can be used for both compression and decompression, since the device 10 can use this knowledge, for example, to compress the data, and the device 20 can decompress the compressed data 16 using the device data 32 to which reference is made in the compressed data 16 simply by means of the memory area information 24. Example embodiments are suitable, for example, for updating firmware, i.e. data which define the operation of the device, which means that the compressed data 16 can have firmware of the device 20.

In other words, a transmission of new or additional data 46 or 38 which are intended to be transmitted to a multiplicity of devices takes place against the background wherein memories of known PCs (Personal Computers) shown schematically in FIG. 3a differ in terms of their content and/or memory locations of matching contents ($44a_3/44b_1$ or $44a_4/44b_2$). In contrast, the memory design or memory layout of an embedded system which is shown in FIG. 3b can be known and can be invariable over different platforms. An exploitation of this information enables efficient utilization of transmission time, a limited bandwidth/bit rate and memory requirements (e.g., due to locations of the buffer storage) by minimizing the volume of data which are to be transmitted.

Figure 4:
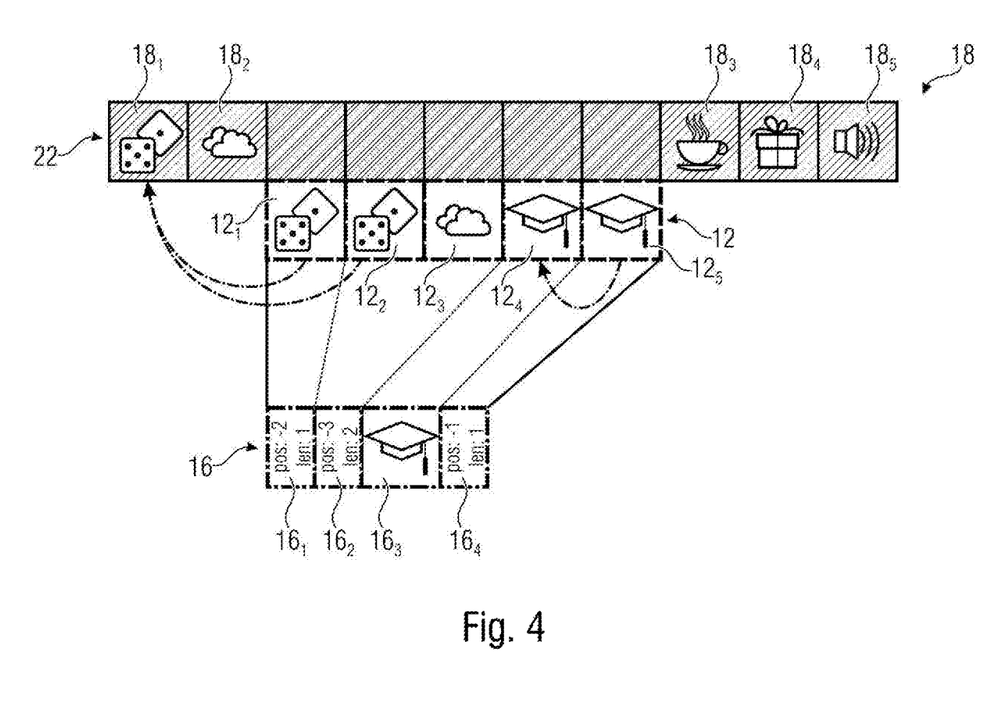
FIG. 4 shows a schematic block diagram to illustrate a data compression according to one example embodiment.

FIG. 4 shows a schematic block diagram to illustrate a data compression according to example embodiments of the type that can be performed, for example, by the control unit 14. Both the number and the content or length of the data described on the basis of the example embodiments described herein are chosen merely by way of example and do not restrict the example embodiments.

Further data 18 can be used to obtain the compressed data 16 from the data 12 which are to be compressed. The data 12 which are to be compressed can have, for example, five data parts, data segments or data words $12_1$ to $12_5$, wherein any other number is possible and the number five is to be understood here merely as an example. According to different example embodiments, at least one, at least two, at least three, at least four, at least six, at least ten or more, for example at least 50, at least 100 or at least 200 data segments can be compressed.

As indicated by the matching symbols, the data segments $12_1$ and $12_2$ can have matching content, in the same way as the data segments $12_4$ and $12_5$. The matching can refer to the fact that the matching is already present in the data 12 which are to be compressed, but can also be understood to mean that the matching is present after the compression which is to be carried out, which can occur for example in the case of lossy compressions where contents differing from one another can be compressed into matching compressed data, for example on the basis of quantizations.

The further data $18_1$ to $18_5$ available in the memory 22 can be understood as being known in advance in a device for decompressing the data.

Example embodiments enable a compression of the data segments $12_1$ and $12_2$ with reference to the further data $18_1$ of the data memory 22, even though the further data $18_1$ are not part of the data 12 which are to be compressed. It can suffice to indicate a memory location and/or a data length. A compressed version $16_1$ of the data segment $12_1$ can thus have, for example, a reference to the position (pos) in the data memory 22. The position can refer absolutely and/or relatively to the location in the data memory 22. A relative position as shown, for example, in FIG. 4, can thus be indicated as an offset or shift in relation to the data segment's own memory position, since the location of the storage of the decompressed data 38 in the target system is also known. It is thus possible to indicate, for example, for the compressed data segment $16_1$ that a pointer indicating a memory area is to be reduced by a value of 2 relative to its own memory position (pos: −2) in order to obtain the data content which is to be used. A data length can further be indicated, i.e. it can be indicated, for example, to use one or more data areas of the target memory, such as if sequences in a plurality of memory areas match, as shown for the compressed data segment $16_2$ which refers to the further data $18_1$ by means of the relative information (pos: −3) and indicates via information relating to the data length "len: 2" that both the further data $18_1$ and the further data $18_2$ are to be used.

A part of the memory area information can indicate the data length (len), that a length of 1, 2 or the respective indicated value at the designated relative address (offset) has a match with the desired target data, thereby simultaneously enabling a reference to a plurality of memory areas also.

In an exemplary embodiment, no suitable template is present in the data memory 22 for the data $12_4$ which are to be compressed, nor is there a preceding version in the data which are to be compressed, and for this reason the data segment $12_4$ which is to be compressed can be contained in the compressed data 16 in uncompressed form as the data segment $16_3$ and simultaneously as a template for the compressed data segment $16_4$ which refers back to this segment via the relative position indication.

If the example from FIG. 4 is considered against the background of the compression capability of the data segments $12_4$ and $12_5$, the data segment $12_4$ which is to be compressed could be compressed if a template could be found for it in the data memory 22. Both the compressed data segment $16_1$ and the compressed data segment $16_2$, exploit this advantage, and for this reason the compressed data 16 have a small data volume (e.g., a data volume of the compressed data 16 may be smaller than a data volume of compressed data obtained by a system that does not use the data memory 22).

Alternatively to a relative position indication referring to a specific data cell or the data segment's own memory location, an absolute memory address can also be indicated, for example a serial number or an identification number of the corresponding memory area in the data memory 22.

Figure 5:
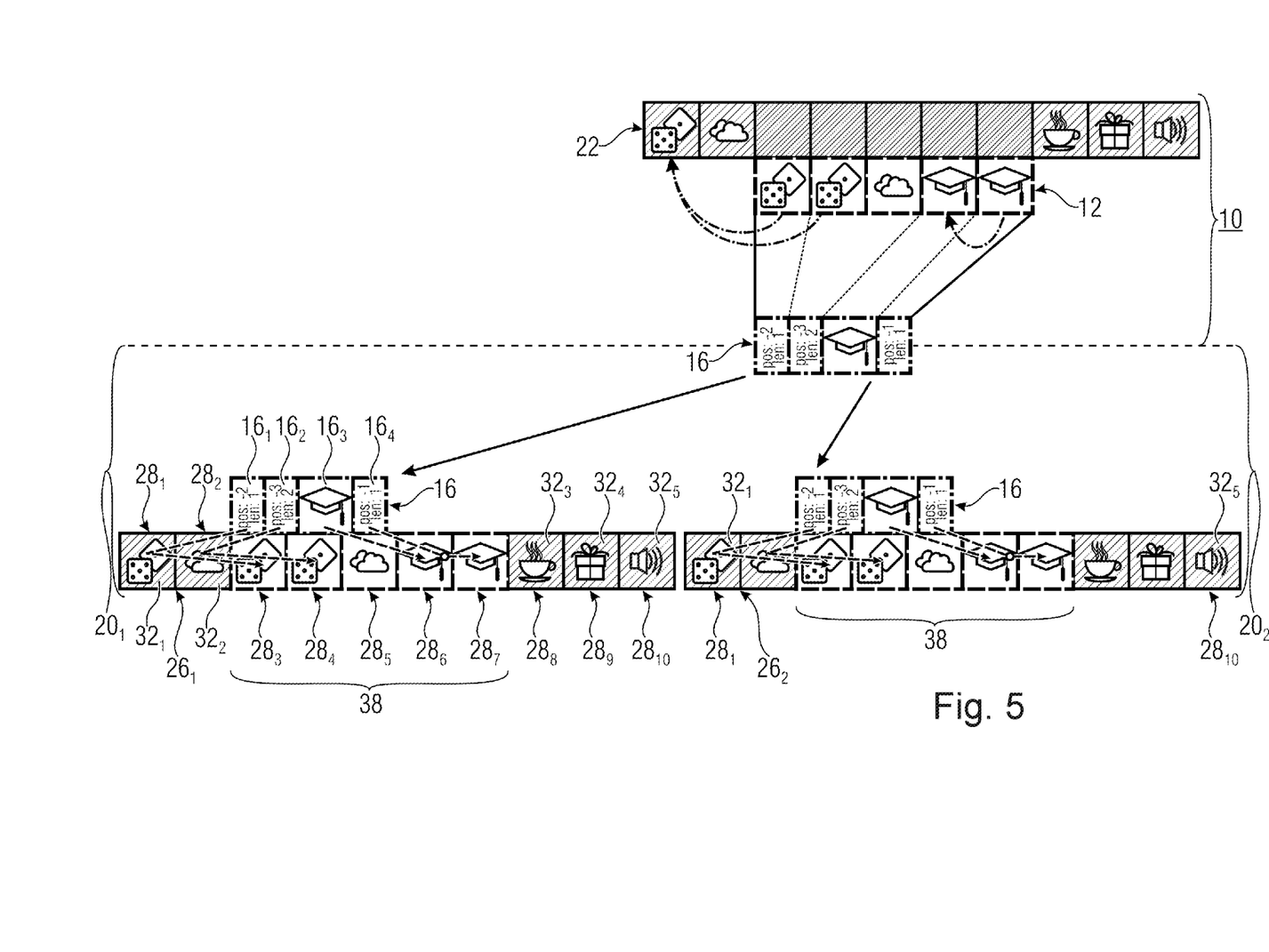
FIG. 5 shows a schematic block diagram of the decompression of the compressed data according to one example embodiment.

FIG. 5 shows a schematic block diagram of the decompression of the compressed data 16. FIG. 5 shows the content of FIG. 4 in an upper area assigned to the device 10 in order to illustrate that the compressed data 16 can be obtained from the data 12 which are to be compressed.

A further area of FIG. 5 shows the transmission of the compressed data 16 to, for example, two devices $20_1$ and $20_2$ which can correspond to the device 20. Any other number of devices 20 can be assumed for this purpose, for example at least one, at least two, at least three, at least four, at least five, at least ten or more.

The devices $20_1$ and $20_2$ can receive the compressed data 16 via the respective data interface 34. On the basis of associated instructions or the previously known behavior of the devices $20_1$ and $20_2$ as, for example, embedded systems, the memory areas $28_3$ to $28_7$ of the data memory $26_1$ or $26_2$ in which the decompressed data 38 are stored are similarly known in advance. Both absolute and relative indications of the memory area information, i.e. not only specific addresses in the memory area but also indications relating to pointers and/or their modification are therefore reliable indications. This means that the control unit 36 can be configured to obtain target information together with the compressed data 16, said target information referring to at least one target memory area of the data memory 26. The control unit can be configured to store the decompressed data 38 in the target memory area. The target information can be part of the compressed data 16 or can be obtained separately. This means that the control unit 14 can obtain an instruction specifying where the decompressed data 38 are to be stored and/or how they are to be used. For this purpose, dedicated information can be output for each data segment or one or more selected areas can simply be defined, for example a first memory area which precedes following memory areas.

A content of the memory area $28_3$ can thus be obtained through reference to the memory area $28_1$ by taking over the content of the latter for the decompressed data 38. The content of the memory areas $28_4$ and $28_5$ can similarly be obtained by taking over the memory areas $28_1$ and $28_2$ on the basis of the memory area information in connection with the compressed data segment $16_2$. A content of the memory area $28_6$ can be obtained by taking over the compressed data segment $16_3$ in order to create a template for the content of the memory area $28_7$, since the compressed data segment $16_4$ supplies a reference to the data area $28_6$, so that a takeover of the content of the latter for the memory area $28_7$ can be employed.

In addition to the obtained small data volume of the compressed data 16, this procedure can be used for a plurality of devices $20_1$ and $20_2$, i.e. the described procedure and the described characteristics of the devices $20_1$ and $20_2$ are also suitable for retaining the matching memory layout between the devices $20_1$ and $20_2$.

The control unit 36 can be configured to extend the compressed data 16 at least partially with the data stored in the memory area, for example the further data 32, in order to decompress the compressed data 16, i.e. to use the further data $32_1$ to $32_5$ in order to obtain the decompressed data 38 from the compressed data 16. The control unit can be configured to store the decompressed data 38 in the data memory 26.

In other words, compared with known concepts for compressing and decompressing data, additional information, i.e. other data, can be used according to example embodiments along with the data of the actual data which are to be compressed, so that a very small data volume of the compressed data is obtained (e.g., a data volume of the compressed data may be smaller than a data volume of compressed data obtained by a system using the known concepts rather than one or more of the techniques presented herein). Since the memory layout, such as the memory layout of embedded systems, is fixed and known according to example embodiments, both new data and existing memory content of the embedded system can be used in order to compress and decompress data, as a result of which the data volume of the compressed data can be further reduced.

Figure 6:
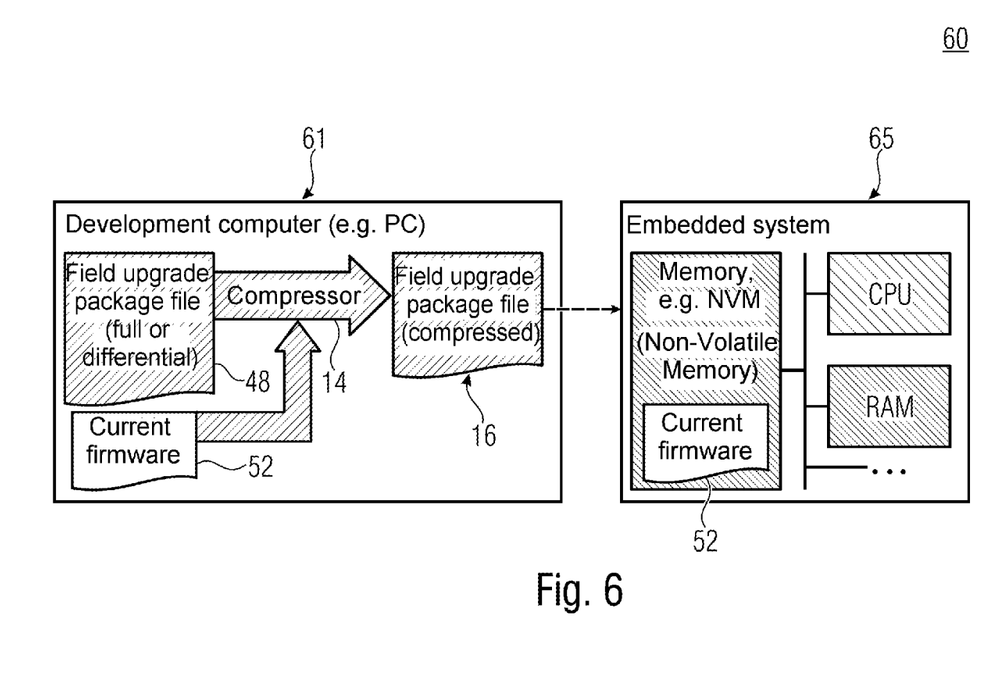
FIG. 6 shows a schematic block diagram of a data transmission system according to one example embodiment.

FIG. 6 shows a schematic block diagram of a data transmission system 60 according to one example embodiment which has a device 61 for compressing data which are to be compressed, as described in connection with the device 10. According to one example embodiment, the device 61 corresponds to the device 10. The data transmission system 60 further has a device 65 for decompressing the compressed data 16, as described in connection with the device 20. According to one example embodiment, the device 65 corresponds to the device 20.

The control unit 14 of the device 61 is configured, for example, to compress a field upgrade package file 48 in order to obtain the compressed data 16. If, for example, the entire data volume, for example firmware, is compressed, this may entail a full upgrade/update. Alternatively, it is similarly possible to take the current firmware 52 into account and to transmit and/or compress the differences/divergences (e.g., transmit and/or compress only the differences/divergences), which can result in a differential upgrade/update (differential field upgrade package).

The compressed data 16 can be transmitted to the device 65 in order to update the firmware 52 by decompressing the compressed data 16.

In other words, for example, current firmware in a non-volatile memory or a volatile memory of an embedded system can be replaced with new firmware. The control device 14 or compressor can be implemented, by way of a non-limiting example, by means of a Python script. It can be based upon the LZ77 algorithm and can be varied in relation to it, wherein other algorithms are also possible. Parts of the current firmware file, for example, which can be stored, for example in Intel HEX format, can be used as an extended dictionary for the LZ77 algorithm.

Figure 7:
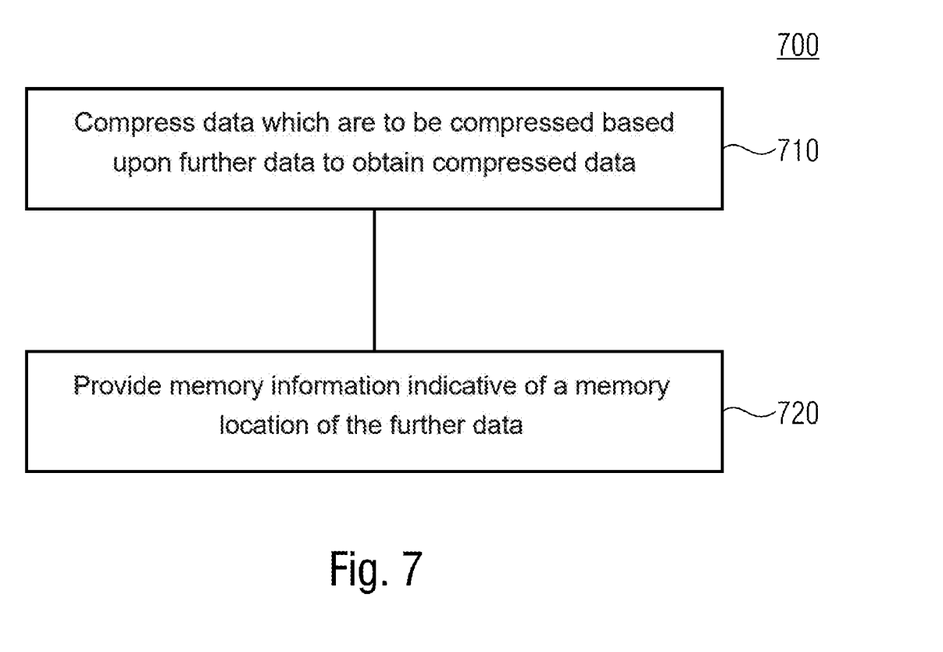
FIG. 7 shows a schematic flow diagram of a method for compressing data which are to be compressed according to one example embodiment.

FIG. 7 shows a schematic flow diagram of a method 700 according to one example embodiment. An act 710 entails compressing in order to compress data (e.g., data which are to be compressed) based upon further data in order to obtain compressed data, for example the compressed data 16. For example, the compressing of act 710 may be performed while incorporating the further data to obtain the compressed data. An act 720 entails providing memory area information which indicates a memory location of the further data. The memory information is provided, for example, in such a way that it is provided to a device for decompression. The memory area information can be specified or defined even before act 710, and can be used in act 710 for the compression so that the memory area information is provided for act 720 also.

Figure 8:
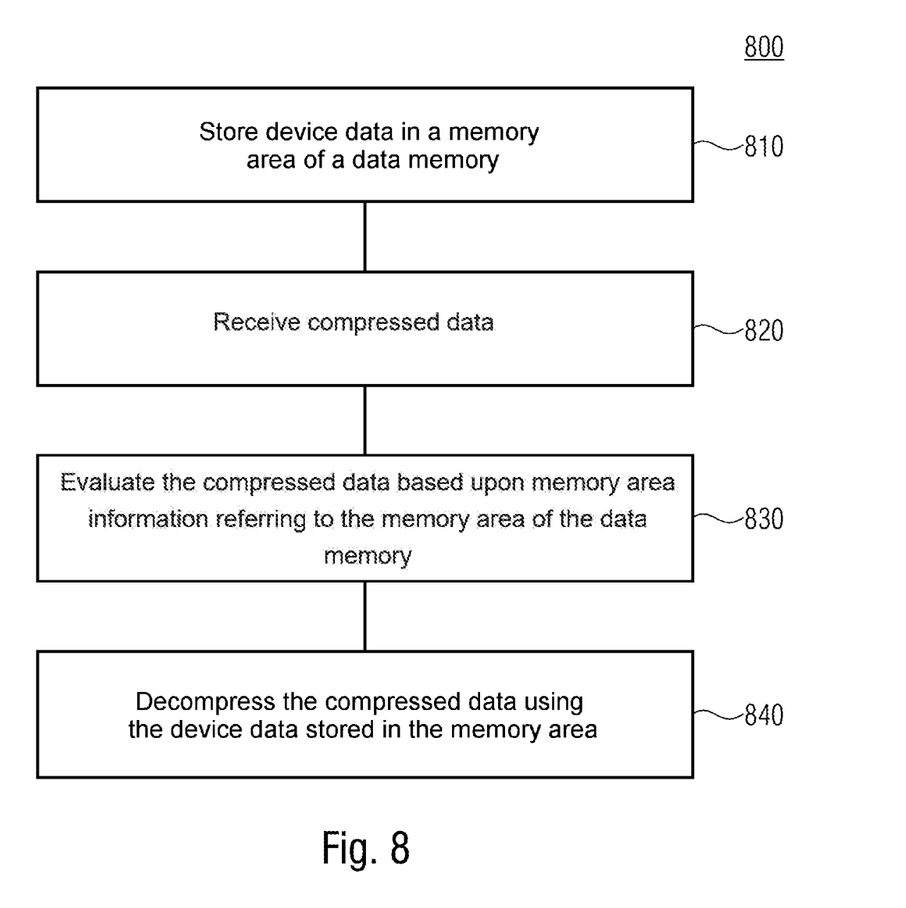
FIG. 8 shows a schematic flow diagram of a method for decompressing compressed data according to one example embodiment.

FIG. 8 shows a schematic flow diagram of a method 800 according to one example embodiment. An act 810 entails storing device data in a memory area of a data memory, for example the device data 32. An act 820 entails receiving the compressed data (e.g., the compressed data may be in addition to and/or apart from the device data), for example the compressed data 16. An act 830 entails evaluating the compressed data based upon (e.g., in terms of) memory area information which refers to the memory area of the data memory.

An act 840 entails decompressing the compressed data using the device data stored in the memory area. For example, the device data may be identified and/or used for decompressing the compressed data based upon an indication, in the memory area information, of the memory area comprising the device data.

Example embodiments enable the data volume of compressed data to be minimized, thus offering advantages, such as in the case of field upgrades, i.e. updates during live operation. Alternatively or additionally, the requirements for the data memories, such as non-volatile memories, can be reduced, since data can be stored in small volumes.

As a result, for example, updates can be performed quickly and transmission times can be minimized.

Although some aspects have been described in connection with a device, these aspects obviously also represent a description of the corresponding method, so that a block or a component of a device should also be understood as a corresponding method act or as a feature of a method act. Similarly, aspects that have been described in connection with or as a method act also represent a description of a corresponding block or detail or feature of a corresponding device.

Depending on specific implementation requirements, example embodiments can be implemented in hardware or in software. The implementation can be carried out using a digital storage medium, for example a floppy disk, a DVD, a Blu-ray disc, a CD, a ROM, a PROM, an EPROM, an EEPROM or a FLASH memory, a hard disk or a different magnetic or optical storage device on which electronically readable control signals are stored which can interact or interact with a programmable computer system in such a way that the respective method is carried out. The digital storage medium can therefore be computer-readable. Some example embodiments therefore comprise a data medium which has electronically readable control signals which are capable of interworking with a programmable computer system in such a way that one of the methods described herein is carried out.

Example embodiments can generally be implemented as a computer program product with a program code, wherein the program code is effective in carrying out one of the methods when the computer program product runs on a computer. The program code can also be stored, for example, on a machine-readable medium.

Other example embodiments comprise the computer program for carrying out one of the methods described herein, wherein the computer program is stored on a machine-readable medium.

In other words, one example embodiment is therefore a computer program which has a program code to carry out one of the methods described herein when the computer program runs on a computer. A further example embodiment is therefore a data medium (or digital storage medium or a computer-readable medium) on which the computer program to carry out one of the methods described herein is recorded.

A further example embodiment is therefore a data stream or a sequence of signals which represent(s) the computer program to carry out one of the methods described herein. The data stream or the sequence of signals may, for example, be configured in such a way as to be transferred via a data communication connection, for example via the Internet.

A further example embodiment comprises a processing device, for example a computer or a programmable logic component which can be configured or adapted in such a way as to carry out one of the methods described herein.

A further example embodiment comprises a computer on which the computer program to carry out one of the methods described herein is installed.

In some example embodiments, a programmable logic component (for example a field-programmable gate array, an FPGA) can be used to perform some or all functionalities of the methods described herein. In some example embodiments, a field-programmable gate array can interwork with a microprocessor to carry out one of the methods described herein. In some example embodiments, the methods are generally carried out by any given hardware device. This may be universally usable hardware such as a computer processor (CPU) or hardware specific to the method, such as, for example, an ASIC.

The example embodiments described above merely represent an illustration of the principles of the present example embodiments. Modifications and variations of the arrangements and details described herein will obviously be evident to other persons skilled in the art. The example embodiments are therefore intended to be limited only by the scope of protection of the claims set out below, and not by the specific details that have been presented by way of the description and the explanation of the example embodiments herein.

Example embodiments according to a first aspect provide a device for compressing first data which are to be compressed, having:

a control unit which is configured to compress the first data based upon (e.g., while incorporating) further data in order to obtain compressed data, and to provide memory area information which indicates a memory location of the further data.

According to a 2nd aspect corresponding to the 1st aspect, the memory information refers to a data memory of a second device which is configured to receive the compressed data.

According to a 3rd aspect corresponding to the 1st aspect, the further data correspond to data whose presence on a second device which is configured to receive the compressed data is known by the device (such as known by the control unit, such as prior to compressing the first data).

According to a 4th aspect corresponding to the 1st aspect, the control unit is configured to compress the first data using a dictionary-based compression, wherein a dictionary associated with the dictionary-based compression comprises information relating to a repetition in the first data and information which has memory area information.

According to a 5th aspect corresponding to the 1st aspect, the control unit is configured to embed the memory area information into the compressed data.

According to a 6th aspect corresponding to the 1st aspect, the control unit is configured to compress the first data in a lossless or lossy manner.

According to a 7th aspect corresponding to the 1st aspect, a device has an interface for transmitting the compressed data.

Example embodiments according to an 8th aspect provide a device for decompressing compressed data, having:

a data memory with a memory area in which device data are stored;

a data interface for receiving the compressed data (e.g., the compressed data may be in addition to and/or apart from the device data); and a control unit which is configured to evaluate the compressed data based upon (e.g., in terms of) memory area information which refers to the memory area of the data memory;

and to decompress the compressed data using the device data stored in the memory area.

According to a 9th aspect corresponding to the 8th aspect, the memory area information indicates at least one of a data length or a data location.

According to a 10th aspect corresponding to the 8th aspect, the data memory has a multiplicity of memory areas, wherein the memory area information indicates at least a subset of the multiplicity of memory areas.

According to an 11th aspect corresponding to the 10th aspect, the control unit is configured to extend the compressed data at least partially with the device data stored in the memory area in order to decompress the compressed data.

According to a 12th aspect corresponding to the 11th aspect, the control unit is configured to obtain decompressed data from the compressed data and to store the decompressed data in the data memory.

According to a 13th aspect corresponding to the 12th aspect, the control unit is configured to obtain, such as together with the compressed data, target information which refers to at least one target memory area of the data memory, wherein the control unit is configured to store the decompressed data in the at least one target memory area.

According to a 14th aspect corresponding to the 8th aspect, the data memory is at least partially a non-volatile memory.

According to a 15th aspect corresponding to the 8th aspect, the data memory is at least partially a volatile memory.

According to a 16th aspect corresponding to the 8th aspect, the compressed data have a firmware of the device.

According to a 17th aspect corresponding to the 8th aspect, the device is an embedded system.

According to a 18th aspect corresponding to the 1st aspect, the memory area information refers absolutely or relatively to the memory area.

According to a 19th aspect corresponding to the 1st aspect, the device is configured to execute an LZ77 algorithm.

Example embodiments according to a 20th aspect provide a method for compressing first data which are to be compressed, having the following acts:

compressing the first data based upon (e.g., while incorporating) further data in order to obtain compressed data; and providing memory area information which indicates a memory location of the further data.

Example embodiments according to a 21st aspect provide a method for decompressing compressed data, having the following acts:

storing device data in a memory area of a data memory;

receiving the compressed data (e.g., the compressed data may be in addition to and/or apart from the device data);

evaluating the compressed data based upon (e.g., in terms of) memory area information which refers to the memory area of the data memory; and decompressing the compressed data using the device data stored in the memory area.

Example embodiments according to a 22nd aspect provide a computer program with a program code to carry out the method according to the 20th or 21st aspect when the program runs on a computer.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

The invention claimed is:

1. A device for compressing first data which are to be compressed, comprising:
   a control unit configured to:
      compress the first data based upon further data to obtain compressed data; and
      provide memory area information indicative of a memory location of the further data;
   wherein at least one of:
      a data memory in which the further data is stored is at least partially a non-volatile memory;
      the data memory is at least partially a volatile memory;
      the compressed data comprise firmware;
      the memory area information refers absolutely or relatively to a memory area; or
      the device is configured to execute an LZ77 algorithm.

2. The device of claim 1, wherein the memory area information refers to a second data memory of a second device configured to receive the compressed data.

3. The device of claim 1, wherein the further data correspond to data whose presence, on a second device configured to receive the compressed data, is known by the device.

4. The device of claim 1, wherein the control unit is configured to compress the first data using a dictionary-based compression, wherein a dictionary associated with the dictionary-based compression comprises:
   information relating to a repetition in the first data; and
   information comprising the memory area information.

5. The device of claim 1, wherein the control unit is configured to embed the memory area information into the compressed data.

6. The device of claim 1, wherein the control unit is configured to compress the first data in a lossless or lossy manner.

7. The device of claim 1, comprising a data interface for transmitting the compressed data.

8. A device for decompressing compressed data, comprising:
   a data memory comprising a memory area in which device data are stored;
   a data interface for receiving the compressed data; and
   a control unit configured to:
      evaluate the compressed data based upon memory area information referring to the memory area of the data memory; and
      decompress the compressed data using the device data stored in the memory area,
   wherein at least one of:
      the data memory is at least partially a non-volatile memory;
      the data memory is at least partially a volatile memory;
      the compressed data comprise firmware of the device;
      the memory area information refers absolutely or relatively to the memory area; or
      the device is configured to execute an LZ77 algorithm.

9. The device of claim 8, wherein the memory area information indicates at least one of a data length of the memory area or a data location of the memory area.

10. The device of claim 8, wherein the data memory comprises a multiplicity of memory areas, wherein the memory area information indicates at least a subset of the multiplicity of memory areas.

11. The device of claim 8, wherein the control unit is configured to extend the compressed data at least partially with the device data stored in the memory area to decompress the compressed data.

12. The device of claim 8, wherein the control unit is configured to:
   obtain decompressed data from the compressed data; and
   store the decompressed data in the data memory.

13. The device of claim 12, wherein the control unit is configured to:
   obtain target information referring to at least one target memory area of the data memory; and
   store the decompressed data in the at least one target memory area.

14. The device of claim 8, wherein the data memory is at least partially the non-volatile memory.

15. The device of claim 8, wherein the data memory is at least partially the volatile memory.

16. The device of claim 8, wherein the compressed data comprise the firmware of the device.

17. The device of claim 8, wherein the memory area information refers absolutely or relatively to the memory area.

18. The device of claim 8, wherein the device is configured to execute the LZ77 algorithm.

19. A method for compressing first data which are to be compressed, comprising:
   determining that a first portion of the first data, but not a second portion of the first data, is associated with one or more differences from further data; and compressing the first data based upon the further data by replacing the second portion of the first data with memory area information associated with the further data to obtain compressed data, wherein the memory area information is in an un-encoded state.

20. A method for decompressing compressed data, comprising:
storing device data in a memory area of a data memory;
receiving the compressed data;
evaluating the compressed data based upon memory area information referring to the memory area of the data memory;
decompressing the compressed data, using the device data stored in the memory area, to obtain decompressed data;
obtaining target information referring to at least one target memory area of the data memory; and
storing the decompressed data in the at least one target memory area.

21. The method of claim 19, wherein the further data comprises firmware.

22. The method of claim 19, wherein the compressed data comprises an uncompressed representation of the first portion of the first data.

23. The method of claim 19, wherein the memory area information comprises a starting position of the further data and length information associated with the further data.

24. A method for compressing first data which are to be compressed, comprising:
determining that a first portion of the first data, but not a second portion of the first data, is associated with one or more differences from further data comprising firmware; and
compressing the first data based upon the further data by replacing the second portion of the first data with memory area information associated with the further data to obtain compressed data.

25. The method of claim 24, wherein the memory area information is in an un-encoded state.

26. The method of claim 24, wherein the memory area information comprises a starting position of the further data and length information associated with the further data.

* * * * *